US006696992B1

(12) United States Patent
Chu (10) Patent No.: US 6,696,992 B1
(45) Date of Patent: Feb. 24, 2004

(54) EFFICIENT DATA ENCODING AND DECODING PROCESSES

(76) Inventor: Allan Chu, 14211 Chester Ave., Saratoga, CA (US) 95070

(*) Notice: Subject to any disclaimer, the term of this patent is extended or adjusted under 35 U.S.C. 154(b) by 41 days.

(21) Appl. No.: 09/967,948

(22) Filed: Oct. 2, 2001

(51) Int. Cl.[7] ................................................ H03M 7/40

(52) U.S. Cl. ........................ 341/67; 341/50; 358/426.13

(58) Field of Search ............................ 341/67, 50, 107, 341/55, 51, 95, 82, 60; 358/426.13

(56) References Cited

U.S. PATENT DOCUMENTS

| | | | | |
|---|---|---|---|---|
| 4,509,038 A | * | 4/1985 | Hirano ................. | 340/347 DD |
| 4,758,975 A | * | 7/1988 | Omada et al. .............. | 364/748 |
| 4,906,991 A | | 3/1990 | Fiala et al. | |
| 5,058,144 A | | 10/1991 | Fiala et al. | |
| 5,109,433 A | | 4/1992 | Notenboom | |
| 5,623,262 A | * | 4/1997 | Normile et al. ................ | 341/67 |
| 5,801,841 A | * | 9/1998 | Suzuki ........................ | 358/433 |

OTHER PUBLICATIONS

IEEE, Transactions On Information Theory, vol. II 23, No. 3, May 1977, pp. 337–343 J. Ziv, A. Lempel, "A Universal Algorithm for Sequential Data Compression".
IEEE, Transactions on Information Theory, vol. II 21, No. 2, Mar. 1975, pp. 194–203, Peter Elias, "Universal Codeword Sets and Representations of the Integers".
IEEE, Transactions on Information Theory, vol. II 24, No. 5, Sep. 1978, pp. 530–536, J. Ziv, A. Lempel, "Compression of Individual Sequences via Variable–Rate Coding".
Australian Computer J., vol. 19, No. 2, pp. 64–68, May 1987, Brent, R.P., "A linear algorithm for data compression".
Communications of the ACM, Apr. 1989, vol. 32, No. 4, pp. 490–504, Edward R. Fiala and Daniel H. Greene, "Data Compression with Finite Windows".
Timothy C. Bell, John G. Cleary, Ian H. Witten, *Text Compression*, Prentice Hall, Englewood Cliffs, N.J., 1990, pp. 206–243.
J. Association for Computing Machinery, vol. 29, No. 4, pp. 928–951, Oct. 1982, Storer, J.A. and Szymanski, T.G., "Data compression via textual substitution".
J. Association for Computing Machinery, vol. 28, No. 1, pp. 16–24, Jan. 1981, Rodeh, M., Pratt, V.R., and Even, S., "Linear algorithm for data compression via string matching".

* cited by examiner

*Primary Examiner*—Brian Young
*Assistant Examiner*—John Nguyen (57) ABSTRACT

A data encoding and decoding system that comprises a composite fixed-variable-length coding process and an offset-difference coding process for improving data compression performance. A composite fixed-variable-length coding process encodes an input data by first comparing the input data to a predetermined threshold, then selecting a coding scheme from two preselected coding schemes and encoding the input data in accordance with the selected coding scheme. The composite fixed-variable-length coding process also generates an identifier to indicate the selected coding scheme to decode the coded output data if a response to comparing the input data with a predetermined threshold differs from a statistically determined response. An offset-difference coding process encodes a paired input data by first determining the greater of the two input data, then calculating the difference between the larger input data and the smaller input data and replacing the larger input data with the calculated difference. The offset-difference coding process also generates an indicator to indicate the input data that has been replaced if said input data is not statistically larger. The composite fixed-variable-length coding process and offset-difference coding process may be used independently or together depending on the applications.

7 Claims, 13 Drawing Sheets

FIG. 1 (PRIOR ART)

| Coding Range | Encoded Bit Strings |
|---|---|
| 0-8191 | x x x x x x x x x x x x x |

FIG. 2 (PRIOR ART)

| Coding Range | Encoded Bit Strings |
|---|---|
| 0 | 1 |
| 1-2 | 0 x 1 |
| 3-6 | 0 x 0 x 1 |
| 7-14 | 0 x 0 x 0 x 1 |
| 15-30 | 0 x 0 x 0 x 0 x 1 |
| 31-62 | 0 x 0 x 0 x 0 x 0 x 1 |
| 63-126 | 0 x 0 x 0 x 0 x 0 x 0 x 1 |
| 127-254 | 0 x 0 x 0 x 0 x 0 x 0 x 0 x 1 |
| 255-510 | 0 x 0 x 0 x 0 x 0 x 0 x 0 x 0 x 1 |
| 511-1022 | 0 x 0 x 0 x 0 x 0 x 0 x 0 x 0 x 0 x 1 |
| 1023-2046 | 0 x 0 x 0 x 0 x 0 x 0 x 0 x 0 x 0 x 0 x 1 |
| 2047-4094 | 0 x 0 x 0 x 0 x 0 x 0 x 0 x 0 x 0 x 0 x 0 x 1 |
| 4095-8190 | 0 x 0 x 0 x 0 x 0 x 0 x 0 x 0 x 0 x 0 x 0 x 0 x 1 |

EFFICIENT DATA ENCODING AND DECODING PROCESSES

CROSS-REFERENCE TO RELATED APPLICATIONS

Not Applicable

STATEMENT REGARDING FED SPONSORED R & D

Not Applicable

REFERENCE TO A MICROFICHE APPENDIX

Not Applicable

BACKGROUND OF THE INVENTION

1. Field of Invention

This invention relates to the field of data compression and decompression of the compressed data.

2. Description of the Related Art

Data compression is a process of converting data such that the converted data can be encoded in fewer bits or bytes. When being decompressed, the compressed data is recovered to its original form. Compressed data saves data storage since smaller-sized data takes less space to store. Compressed data can also enhance data transmission rates since smaller-sized data requires less time to transmit. Compression techniques have long been used in storage media such as tapes, disks, and flash cards, as well as communication equipment, such as the modem and Ethernet. With the rapidly growing demand for the Internet as well as handheld and wireless devices, compression plays an even bigger role than ever in terms of data transmission and storage.

Figure 1:
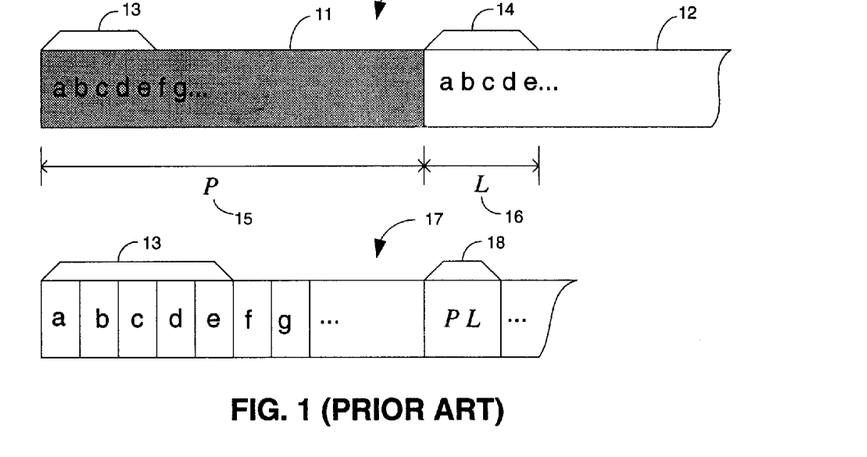
FIG. 1 illustrates an example of a typical compression scheme using Ziv-Lempel coding approach.

As shown in FIG. 1, a typical LZ data compression method processes an input data stream 10 to generate a compressed output data stream 17 by comparing an unprocessed data portion 12 of the input data stream 10 to already processed data in a history buffer 11. If a data string 13 found in the history buffer 11 matches a current data string 14 in the unprocessed data portion 12, the current data string 14 is replaced by a pointer (P, L) that corresponds to an offset P 15 and a match length L 16. The offset P 15 and match length L 16 are then encoded individually with either a fixed-length coding or a variable-length coding process. Thus, the current data string 14 is represented by a shorter coded pointer data (P, L) 18 in the compressed output data stream 17.

Figure 2:
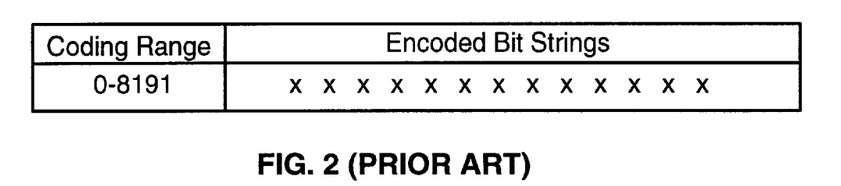
FIG. 2 illustrates an example of a 13-bit fixed-length coding scheme.
Figure 3:
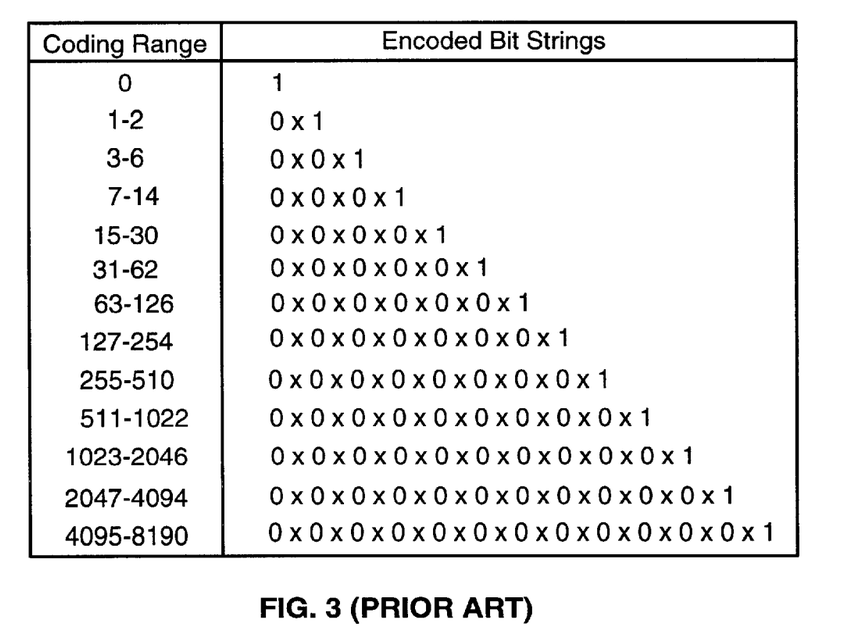
FIG. 3 illustrates an example of a variable-length coding scheme.

As shown in FIG. 2, fixed-length coding uses a fixed number of bits to encode a range of numbers. For example, if the number "7" were coded in a 13-bit fixed-length coding scheme, the encoded bit string would be "0000000000111". In another case, if the number "4096" were coded in a 13-bit fixed-length coding scheme, the encoded bit string would be "1000000000000". Thus, an n-bit fixed-length coding scheme encodes up to $2^n$ numbers ranging from 0 to $(2^n-1)$. Variable-length coding, on the other hand, uses a variable number of bits to encode a range of numbers. There are many different variable-length coding schemes suited to different needs. FIG. 3 illustrates an example of a variable-length coding table that encodes up to 8,191 numbers ranging from 0 to 8,190. Variable-length coding typically encodes smaller numbers in fewer bits and larger numbers in more bits. For example, coding the number "4096" using the variable-length coding table shown in FIG. 3 would take 25 bits. However, coding the number "7" using the same variable-length coding table would only take 7 bits. Thus, compared to variable-length coding, fixed-length coding generally tends to be more efficient in coding larger numbers, but less efficient in coding smaller numbers.

How to encode data efficiently is essential to achieving a good compression result. Prior methods typically encode match length L 16 with variable-length coding and offset P 15 with fixed-length coding. While match length L 16 is normally a small number, offset P 15 falls within a wide range of values determined by the size of the history buffer 11. Offset P 15 has an upper bound that increases as the size of the history buffer 11 increases. Thus, coding offset P 15 strictly with fixed-length coding as do most of the prior methods is less desirable when offset P 15 turns out to be a small number, e.g. "7". On the other hand, coding offset P 15 strictly in variable-length coding is less desirable either when offset P 15 happens to be a large number, e.g. "4096". Thus, combining different coding schemes into a single coding scheme is able to maximize the efficiencies of data encoding.

Since smaller data requires fewer bits to encode prior methods try to reduce the number of bits to encode data through methods such as replacing a matching data string with a pointer data (P, L) as illustrated in FIG. 1. However, it is desirable to further reduce the value of a data before encoding.

BRIEF SUMMARY OF THE INVENTION

A data encoding and decoding system for improving data compression performance is provided in accordance with the principles of this invention. The data encoding and decoding system comprises a composite fixed-variable-length coding process and an offset-difference coding process for encoding and decoding data. The encoding process of composite fixed-variable-length coding encodes an input data by first comparing the input data to a predetermined threshold, then selecting a coding scheme from two preselected coding schemes and encoding the input data in accordance with the selected coding scheme. The encoding process of composite fixed-variable-length coding also generates an identifier to indicate the selected coding scheme if the response to comparing the input data with a predetermined threshold differs from a statistically determined response. The decoding process of composite fixed-variable-length coding first detects if an identifier exists in a codeword in a coded data stream, then decodes the codeword with a coding scheme that was selected in the corresponding encoding process.

A composite coding system provided in accordance with the principles of this invention encodes a paired input data by encoding the statistically larger one of the paired input data with a composite fixed-variable-length coding process and the statistically smaller one of the paired input data with a stand-alone coding process.

The encoding process of offset-difference coding encodes a paired input data by first determining the greater of the two input data, then calculating the difference between the larger input data and the smaller input data, replacing the larger input data with the calculated difference, and encoding said calculated difference and the smaller input data. The encoding process of offset-difference coding also generates an indicator to indicate the input data that has been replaced if said input data is not statistically larger. The decoding process of offset-difference coding first detects if an indicator exists in a codeword in a coded data stream, then decodes and reconstructs the original data.

The composite fixed-variable-length coding process described in accordance with the principles of this invention combines different coding schemes into a single coding scheme to encode a data. It thus maximizes the efficiencies and minimizes the deficiencies of a coding scheme. The offset-difference coding process described in accordance with the principles of this invention minimizes the number of bits required to encode a data by further reducing the value of the data. Data with smaller values require fewer bits to encode, especially in a variable-length coding scheme. Thus, the two processes improve the compression performance of LZ-based compression methods without compromising the memory resource or compression/decompression speed. The two processes may be used independently or together depending on the application.

BRIEF DESCRIPTION OF DRAWINGS

FIG. 4b illustrates a preferred embodiment of the composite fixed-variable-length coding encoding process shown in FIG. 4a;

FIG. 5a illustrates a block diagram of one embodiment of a composite coding decoding system corresponding to the encoding system shown in FIG. 4a;

FIG. 11a illustrates a block diagram of one embodiment of a joint composite coding and offset-difference coding decoding system corresponding to the encoding system shown in FIG. 10a;

DETAILED DESCRIPTION OF THE INVENTION

Figure 4A:
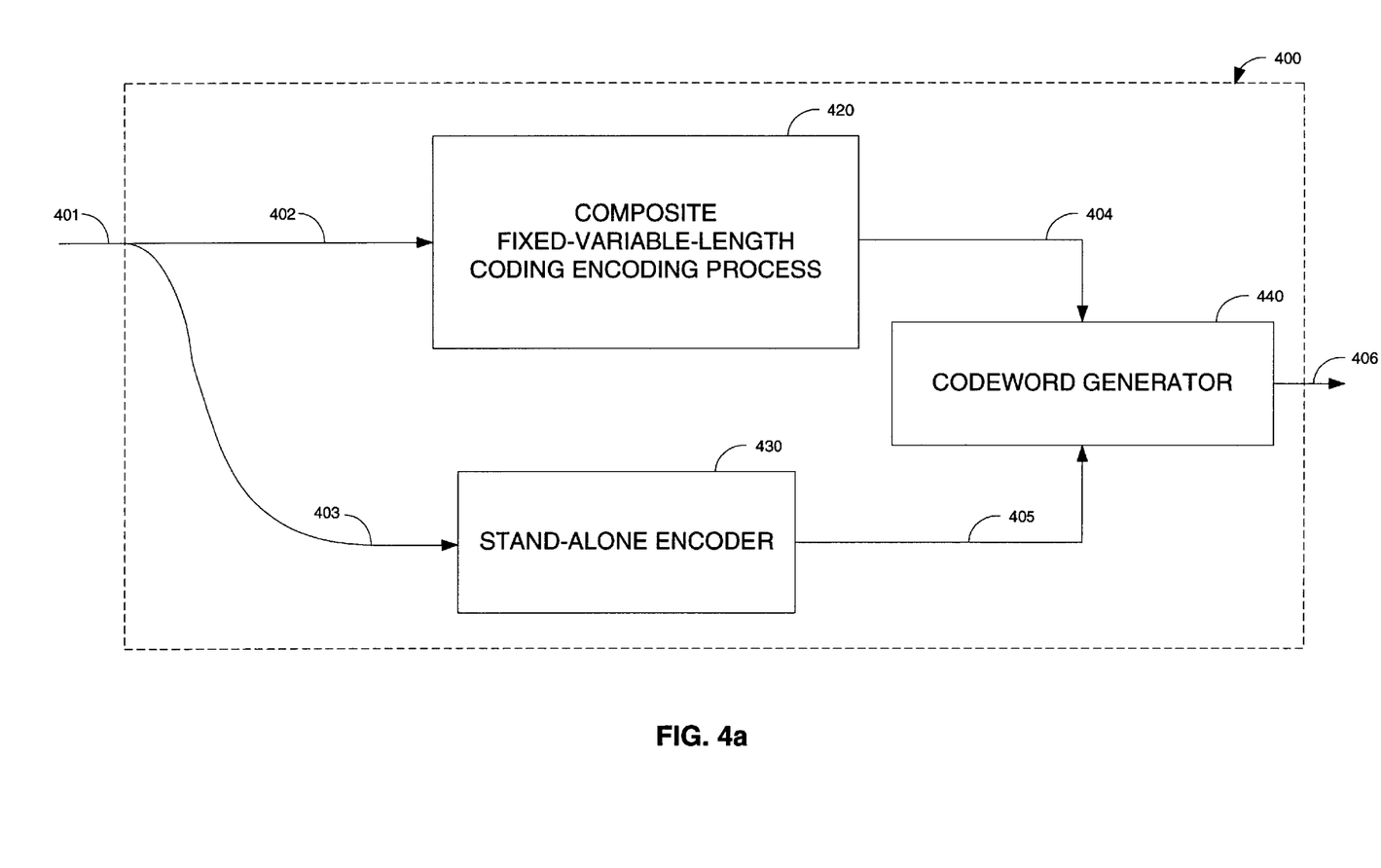
FIG. 4a illustrates a block diagram of one embodiment of a composite coding encoding system in accordance with the principles of this invention.

FIG. 4a illustrates a block diagram of one embodiment of a composite coding encoding system constructed in accordance with the principles of this invention. Composite coding encoding system 400 comprises a composite fixed-variable-length coding encoding process 420 to encode data with a selected coding scheme and a stand-alone encoder 430 to encode data with variable-length coding. Input 402 to composite fixed-variable-length coding encoding process 420 is typically a data with a wide range of values such as offset P 15 shown in FIG. 1. Input 403 to stand-alone encoder 430, on the other hand, is normally a data with a fairly small value such as match length L 16 shown in FIG. 1. Composite fixed-variable-length coding encoding process 420 selects a coding scheme from two preselected coding schemes in response to comparing the input data 402 to a predetermined threshold. The two preselected coding schemes can be fixed and variable-length coding, or fixed and fixed-length coding, or variable and variable-length coding as shown in TABLE 1. Composite fixed-variable-length coding encoding process 420 also generates an identifier I with a unique pattern to indicate the selected coding scheme if the response to comparing the input data to a predetermined threshold differs from a statistically determined response.

Figure 8:
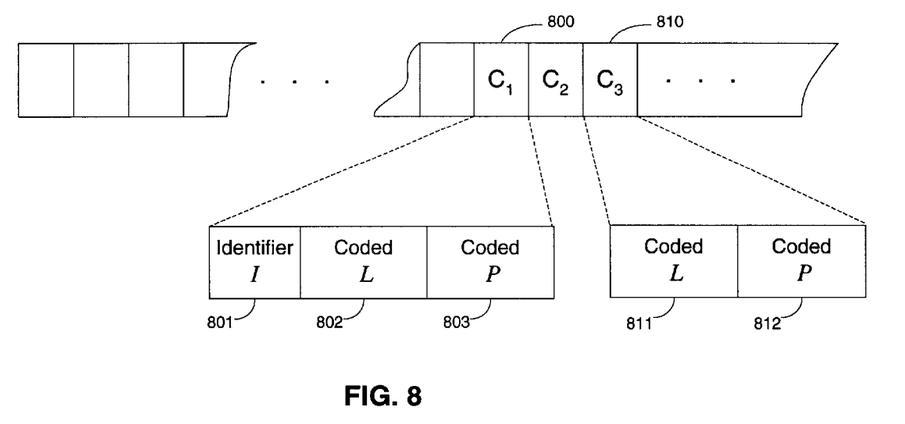
FIG. 8 illustrates an example of a format of coded output data produced by a composite coding encoding system in accordance with the principles of this invention.

Composite coding encoding system 400 receives an input data stream 401 such as, but not limited to, a stream of pointer data (P, L), corresponding to an offset P 15 and a match length L 16 shown in FIG. 1. The input data stream could also be a NodeCopy (N, D) or a LeafCopy (D, L) in the LZ78 family of data compression methods (see Communications of the ACM, Apr. 1989, vol.32, No. 4, pp. 490–504, Edward R. Fiala and Daniel H. Greene, "Data Compression with Finite Windows"). Codeword generator 440 combines coded data P 404 with or without an identifier I generated by composite fixed-variable-length coding encoding process 420 and coded data L 405 generated by stand-alone encoder 430 to generate a codeword and appends to an output data stream 406. FIG. 8 illustrates an example of coded output data produced by composite coding encoding system 400, wherein $C_1$ 800 is a codeword of coded L 802 and coded P 803 with Identifier I 801, and $C_3$ 810 is a codeword of coded L 811 and coded P 812 without identifier I.

TABLE 1

| Option | Coding Scheme 1 | Coding Scheme 2 |
| --- | --- | --- |
| 1 | Fixed-length coding | Variable-length coding |
| 2 | Fixed-length coding | Fixed-length coding |
| 3 | Variable-length coding | Variable-length coding |

Figure 4B:
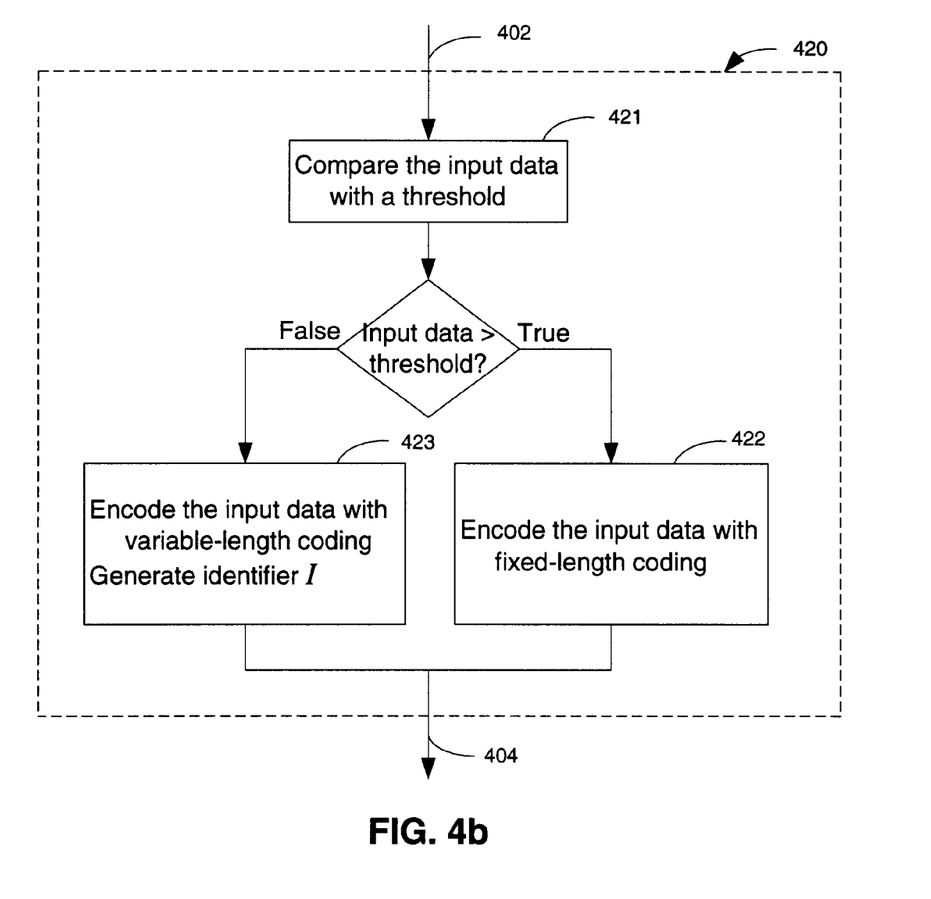

FIG. 4b illustrates a preferred embodiment of the composite fixed-variable-length coding encoding process 420 shown in FIG. 4a. The two preselected coding schemes in a preferred embodiment of the composite fixed-variable-length coding encoding process 420 are fixed and variable-length coding as shown in option 1 of TABLE 1. Composite fixed-variable-length coding encoding process 420 encodes input data 402 by first comparing the input data 402 to a threshold in step 421. If input data 402 exceeds the threshold, composite fixed-variable-length coding encoding process 420 encodes input data 402 with a fixed-length coding scheme in step 422. If, however, input data 402 does not exceed the threshold, composite fixed-variable-length coding encoding process 420 L then encodes input data 402 with a variable-length coding scheme and also generates an identifier I in step 423 with a unique pattern to indicate the selected coding scheme. The coded data 404 along with or without an identifier I is then processed by a codeword generator 440 in FIG. 4a. Composite fixed-variable-length coding encoding process 420 then continues encoding the next input data 402.

Identifier I is only generated when the response to comparing an input data to a threshold differs from a statistically determined response. The preferred embodiment of a composite fixed-variable-length coding encoding process shown in FIG. 4b is based on a statistically determined presumption that an input data would normally exceed the threshold. Thus, composite fixed-variable-length coding encoding process 420 generates an identifier I in step 423 when an input data fails to exceed the threshold.

The threshold used in the preferred embodiment of a composite fixed-variable-length coding encoding process in FIG. 4b is predetermined based on the two pre-selected coding schemes. A threshold should be set at the point when encoding in one coding scheme becomes more efficient than encoding in the other. Take the preferred embodiment in FIG. 4b as an example. The threshold is calculated from the following:

$$L(I)+C_v(K)<C_f(\theta)$$

where $L(I)$ is the number of bits to represent identifier I, $C_v(K)$ is the number of bits for encoding an input data 402 with variable-length coding, and $C_f(\theta)$ is the number of bits for encoding an input data 402 with fixed-length coding. When the left-hand side of the equation is smaller than the right-hand side of the equation, it is more efficient to encode a data with variable-length coding; otherwise, it is more efficient to encode a data with fixed-length coding. Note $L(I)$ is an overhead when encoding with variable-length coding since whenever a variable-length coding scheme is used in the preferred embodiment shown in FIG. 4b an identifier is generated. Since $L(I)$ and $C_f(\theta)$ are fixed, the only variable is $C_v(K)$. Therefore, a threshold can be set at the largest K that satisfies this equation.

Figure 5A:
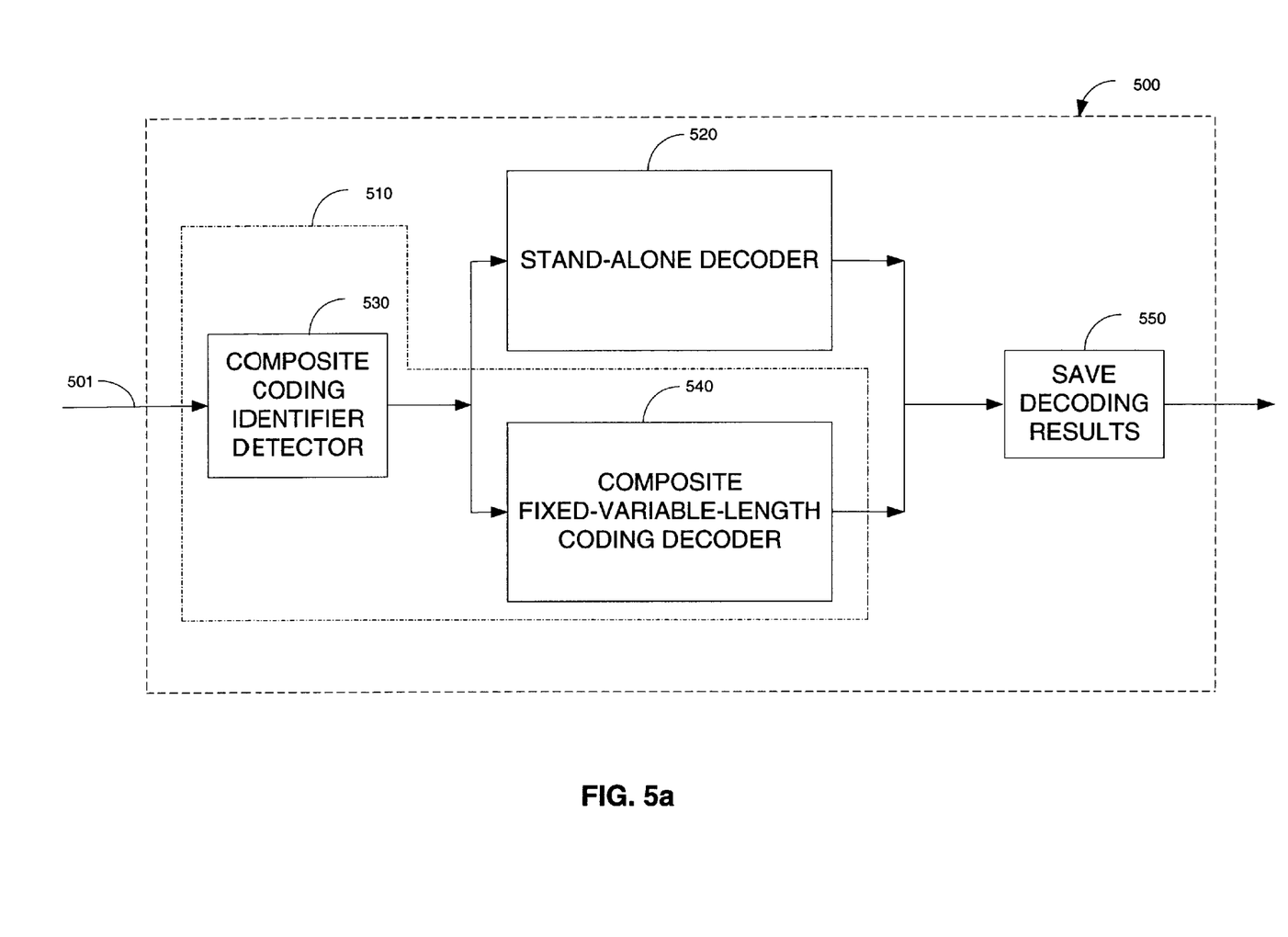

FIG. 5a illustrates a block diagram of one embodiment of a composite coding decoding system corresponding to the encoding system shown in FIG. 4a. Composite coding decoding system 500 comprises a composite fixed-variable-length coding decoding process 510 and a stand-alone decoder 520 to decode a coded input data stream 501. Composite coding identifier detector 530 starts to decode a codeword in a coded input data stream 501 by first detecting the existence of an identifier. Stand-alone decoder 520 then decodes with variable-length coding either the current element in the codeword: coded L 811 if an identifier is not detected or the next element in the codeword: coded L 802 if an identifier I 801 is detected (see FIG. 8). Composite fixed-variable-length coding decoder 540 then selects a decoding scheme in response to the detection of an identifier in 530 and decodes the following element in the codeword: coded P 812 or coded P 803 in accordance with the selected decoding scheme. Composite coding decoding system 500 then restores and saves the decoding results in a decoding buffer in step 550 and continues decoding the next codeword in the coded data stream 501.

Figure 5B:
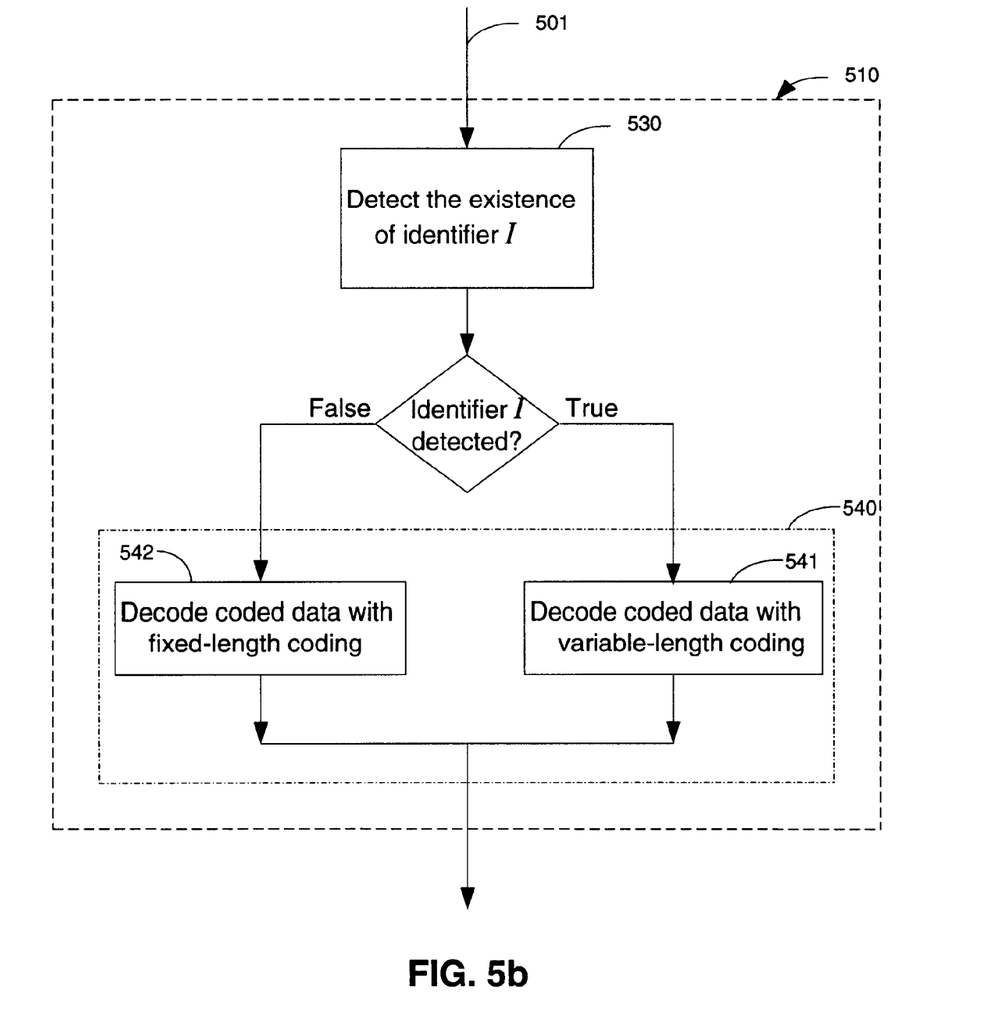
FIG. 5b illustrates a preferred embodiment of a composite fixed-variable-length coding decoding process corresponding to the encoding process shown in FIG. 4b.

FIG. 5b illustrates a preferred embodiment of a composite fixed-variable-length coding decoding process corresponding to the encoding process shown in FIG. 4b. Composite fixed-variable-length coding decoding process 510 decodes coded input data 501 by first detecting if identifier I exists in step 530. If identifier I is detected, composite fixed-variable-length coding decoder 540 decodes the coded data with a variable-length coding scheme in step 541. If, however, identifier I is not detected, composite fixed-variable-length coding decoder 540 then decodes the coded data with a fixed-length coding scheme in step 542. Composite fixed-variable-length coding decoding process 510 then continues decoding the next coded input data 501.

Figure 6:
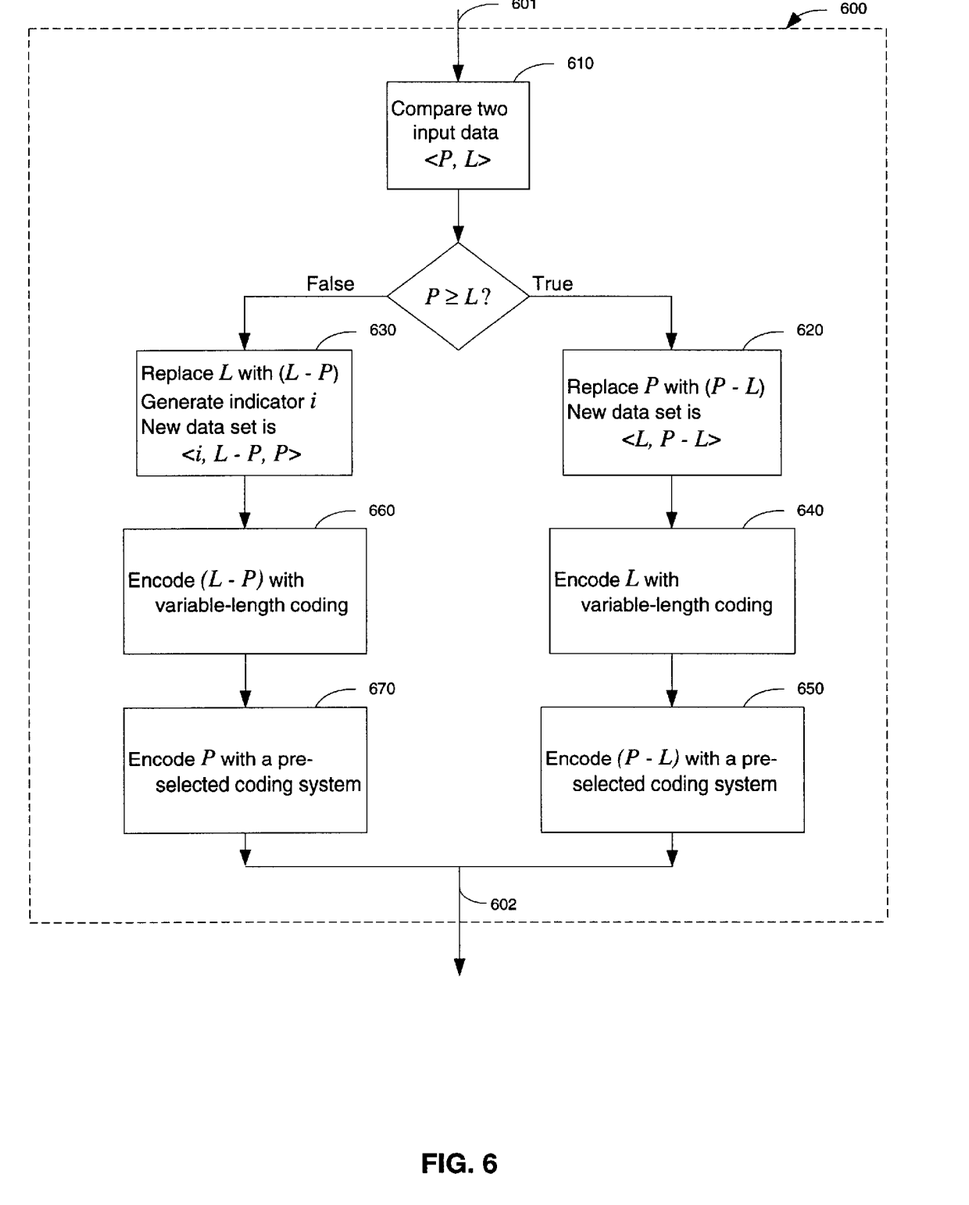
FIG. 6 illustrates a preferred embodiment of an offset-difference coding encoding process in accordance with the principles of this invention.
Figure 9:
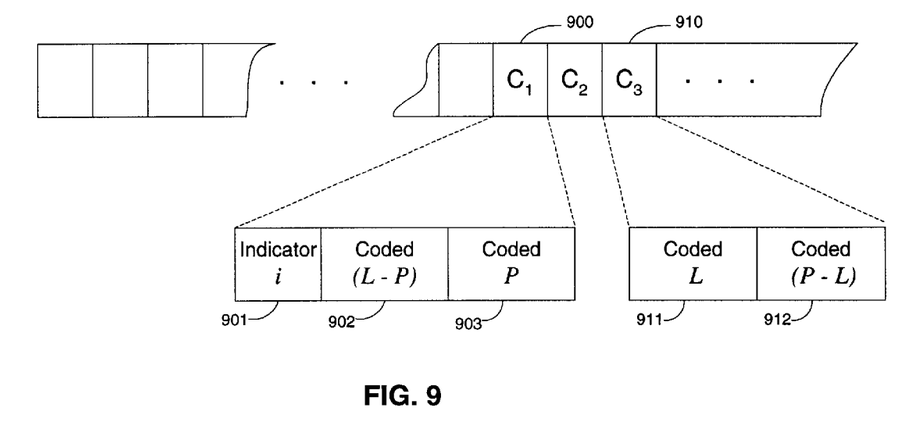
FIG. 9 illustrates an example of a format of coded output data produced by the encoding process of an offset-difference coding in accordance with the principles of this invention.

FIG. 6 illustrates a preferred embodiment of an offset-difference coding encoding process constructed in accordance with the principles of this invention. Offset-difference coding encoding process 600 receives a stream of paired data <P, L> 601 and compares the paired data <P, L> 601 in step 610 to determine the greater of the two input data. If data P is greater than or equal to data L, offset-difference coding encoding process 600 then subtracts data L from data P, replaces data P with the difference (P−L), and forms a new data set <L, P−L> in step 620. Offset-difference coding encoding process 600 then encodes the new data set by encoding data L with variable-length coding in step 640 and data (P−L) with a preselected coding system in step 650, and appends to an output data stream 602. If, however, data L is greater than data P, offset-difference coding encoding process 600 then subtracts data P from data L, replaces data L with the difference (L−P), generates an indicator i with a unique pattern to indicate the data that has been replaced is in fact data L instead of data P, and forms a new data set <i, L−P, P> in step 630. Offset-difference coding encoding process 600 then encodes the new data set by encoding data (L−P) with variable-length coding in step 660 and data P with a preselected coding scheme in step 670, and appends to an output data stream 602. FIG. 9 illustrates an example of coded output data produced by offset-difference coding encoding process 600, wherein $C_1$ 900 is a codeword of coded data (L−P) 902 and coded data P 903 with indicator i 901, and $C_3$ 910 is a codeword of coded data L 911 and coded data (P−L) 912 without indicator i. Offset-difference coding encoding process 600 then continues encoding the next input data pair 601.

Indicator i is only generated when the greater of the two input data is not statistically larger. The preferred embodiment of an offset-difference coding encoding process 600 shown in FIG. 6 assumes that data P is statistically greater than data L. Thus offset-difference coding encoding process 600 generates indicator i in step 630 when data L is greater than data P.

The preselected coding scheme for coding data (P−L) in step 650 and data P in step 670 could be either fixed-length coding or variable-length coding. However, for greater benefit variable-length coding is preferred because of the flexible nature of variable-length coding.

Figure 7:
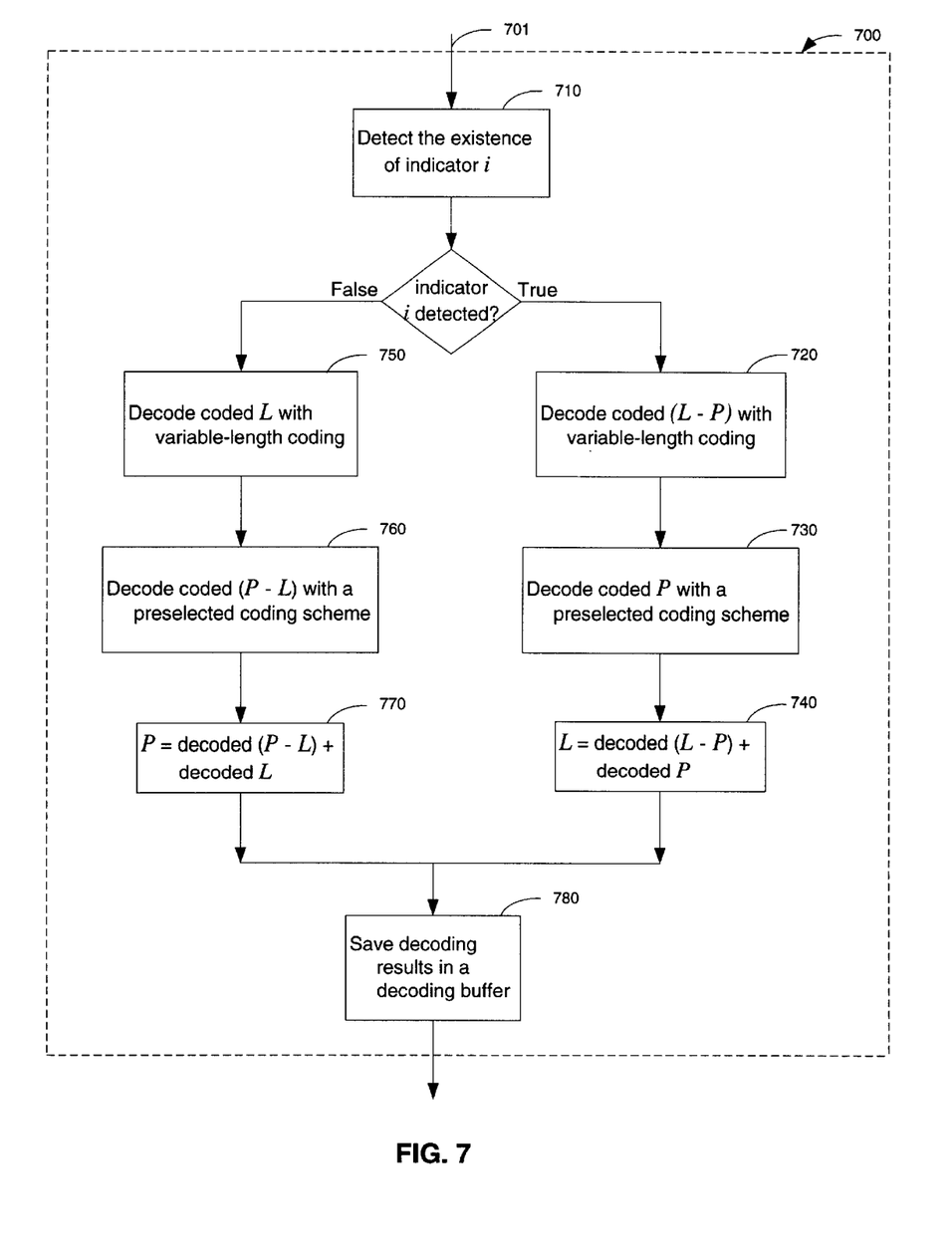
FIG. 7 illustrates a preferred embodiment of an offset-difference coding decoding process corresponding to the encoding process shown in FIG. 6.

FIG. 7 illustrates a preferred embodiment of an offset-difference coding decoding process corresponding to the encoding process shown in FIG. 6. Offset-difference coding decoding process 700 decodes a codeword in a coded input data stream 701 by first detecting the existence of an indicator in step 710. If indicator i 901 is detected, offset-difference coding decoding process 700 then decodes the following two elements of the codeword: coded (L−P) 902 with variable-length coding in step 720 and coded P 903 with a preselected decoding scheme in step 730 (see FIG. 9), and recovers data L by adding decoded (L−P) to decoded P in step 740. If, however, indicator i is not detected, offset-difference coding decoding process 700 then decodes the current element of the codeword: coded L 911 with variable-length coding in step 750, the next element of the codeword: coded (P–L) 912 in step 760, and recovers data P by adding decoded (P–L) to decoded L in step 770. Offset-difference coding decoding process 700 then restores data P and data L to the original data pair (P, L) and saves the decoding results in a decoding buffer in step 780, and continues decoding the next codeword.

Figure 10A:
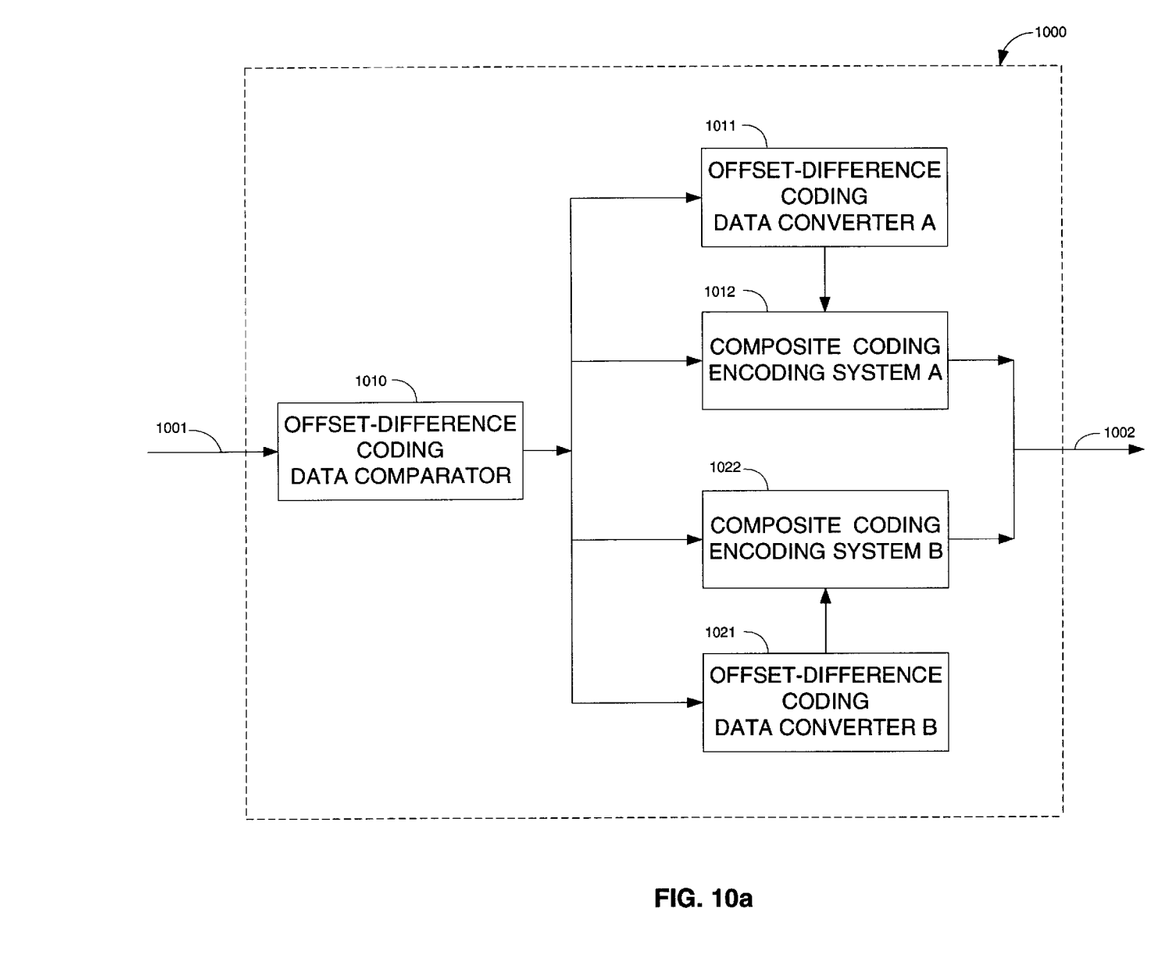
FIG. 10a illustrates a block diagram of one embodiment of a joint composite coding and offset-difference coding encoding system in accordance with the principles of this invention.

FIG. 10*a* illustrates a block diagram of one embodiment of a joint composite coding and offset-difference coding encoding system 1000 constructed in accordance with the principles of this invention. Joint composite coding and offset-difference coding encoding system 1000 combines the encoding process of composite fixed-variable length coding and offset-difference coding to encode data. A joint composite coding and offset-difference coding encoding system 1000 comprises an offset-difference coding data comparator 1010, two offset-difference coding data converters: A 1011 and B 1021, and two composite coding encoding systems: A 1012 and B 1022. Offset-difference coding data comparator 1010 receives a stream of paired data and determines the greater of the two input data. Offset-difference coding data converter A 1011 replaces the larger one of the two input data with the difference between them when the larger data is in fact statistically larger. Offset-difference coding data converter B 1021, on the other hand, replaces the larger one of the two input data with the difference between them when the larger data is in fact statistically smaller. Offset-difference coding data converter B 1021 also generates an indicator with a unique pattern to indicate the data that has been replaced is the statistically smaller one.

Composite coding encoding system A 1012 compares the difference between the two input data to a predetermined threshold and selects a coding scheme from two preselected coding schemes. If the selected coding scheme is associated with offset-difference coding, the composite fixed-variable-length coding encoding process 420 of composite coding encoding system A 1012 encodes the data that has been replaced by offset-difference coding data converter A 1011 in accordance with the selected coding scheme (see FIG. 4*a*). Otherwise, the composite fixed-variable-length coding encoding process 420 of composite coding encoding system A 1012 encodes the larger data in accordance with the selected coding scheme. The stand-alone encoder 430 of composite coding encoding system A 1012 then encodes the smaller data with variable-length coding. Composite coding encoding system A 1012 also generates an identifier if the response to comparing the difference between the two input data to the predetermined threshold is different from a statistically determined response.

Composite coding encoding system B 1022 compares the difference between the two input data to a different threshold which is also predetermined and selects a coding scheme from two same preselected coding schemes. The composite fixed-variable-length coding encoding process 420 of composite coding encoding system B 1022 encodes the smaller data in accordance with the selected coding scheme. If the selected coding scheme is associated with offset-difference coding, the stand-alone encoder 430 of composite coding encoding system B 1022 encodes the data that has been replaced by offset-difference coding data converter B 1021 with variable-length coding. Otherwise, the stand-alone encoder 430 of composite coding encoding system B 1022 encodes the larger data with variable-length coding. Composite coding encoding system B 1022 also generates an identifier if the response to comparing the difference between the two input data to the predetermined threshold in composite coding encoding system A 1012 is different from a statistically determined response.

Figure 10B:
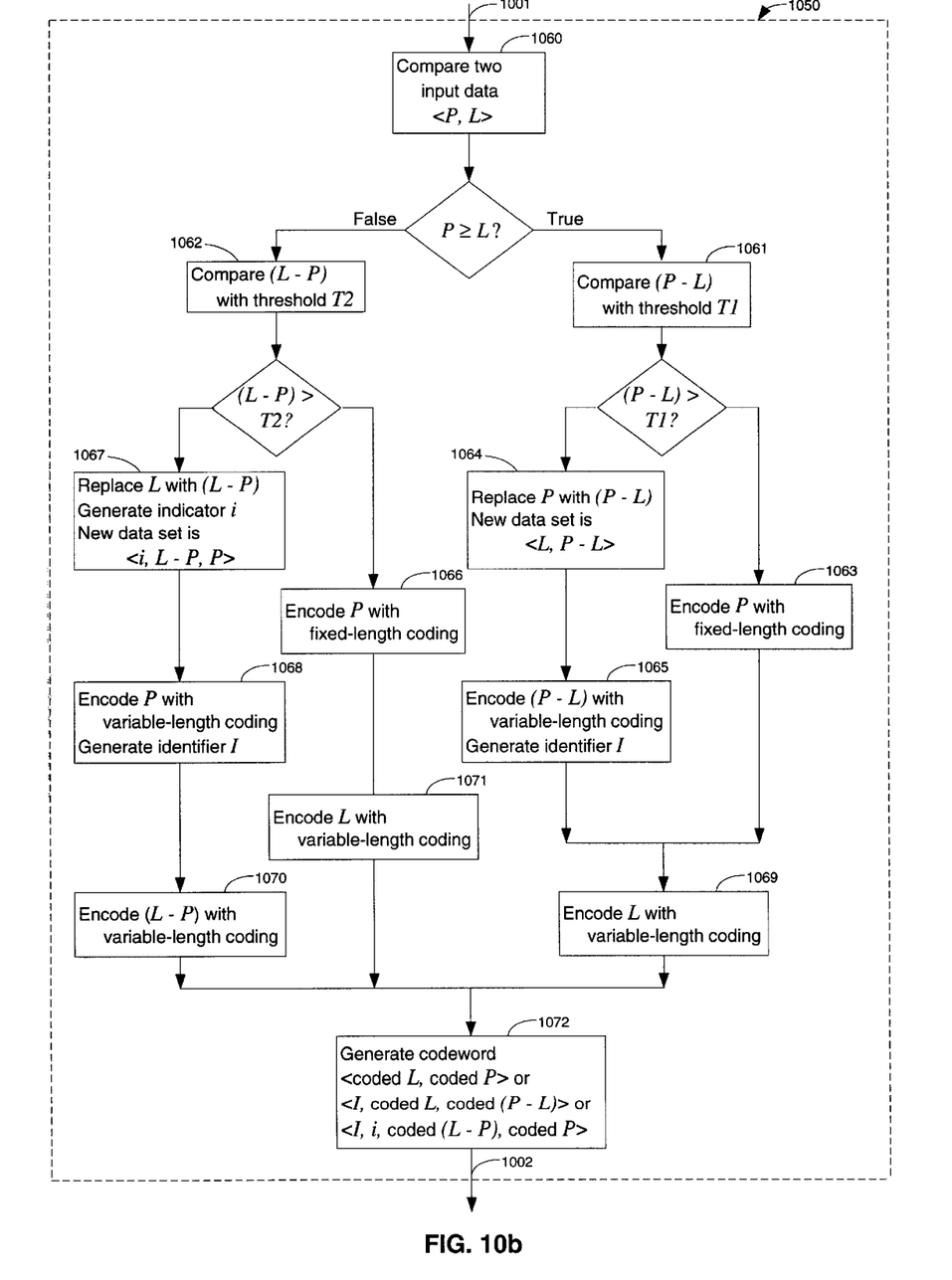
FIG. 10b illustrates a detailed block diagram of a preferred embodiment of a joint composite coding and offset-difference coding encoding process in accordance with the principles of this invention.

FIG. 10*b* illustrates a detailed block diagram of a preferred embodiment of a joint composite coding and offset-difference coding encoding process constructed in accordance with the principles of this invention. Joint composite coding and offset-difference coding encoding process 1050 receives an input data stream 1001 such as, but not limited to, a stream of pointer data (P, L), corresponding to an offset P 15 and a match length L 16 shown in FIG. 1. The preferred embodiment assumes that data P is statistically larger than data L, the two preselected coding schemes are fixed-length coding and variable-length coding shown in option 1 of TABLE 1, and offset-difference coding is associated with the variable-length coding scheme. Joint composite coding and offset-difference coding encoding process 1050 compares data pair <P, L> 1001 in step 1060 to determine the greater of the two input data. If data P is greater than or equal to data L, joint composite coding and offset-difference coding encoding process 1050 then compares the difference between data P and data L, i.e. (P–L), to a predetermined threshold T1 in step 1061. If (P–L) is greater than threshold T1, then joint composite coding and offset-difference coding encoding process 1050 encodes data P with a fixed-length coding scheme in step 1063. If, however, (P–L) is not greater than threshold T1, joint composite coding and offset-difference coding encoding process 1050 then replaces data P with (P–L) to form a new data set: <L, P–L> in step 1064 before encoding (P–L) with a variable-length coding scheme in step 1065. Joint composite coding and offset-difference coding encoding process 1050 also generates an identifier I in step 1065 with a unique pattern to indicate the selected coding scheme to decode the coded output data. Joint composite coding and offset-difference coding encoding process 1050 then encodes data L with variable-length coding in step 1069 and generates either codeword <coded L, coded P> or codeword <I, coded L, coded (P–L)> in step 1072.

Figure 12:
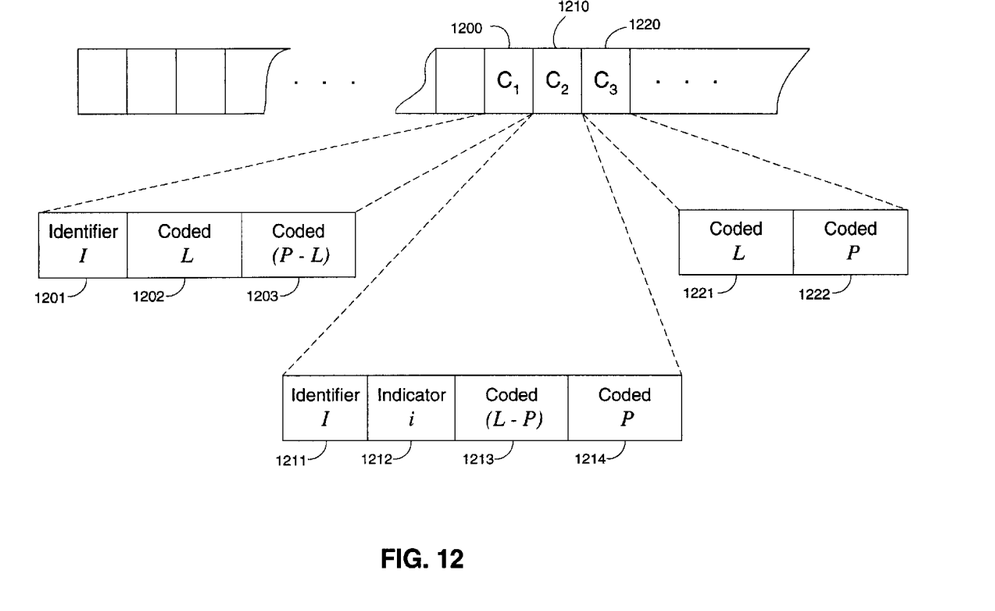
FIG. 12 illustrates an example of a format of coded output data produced by the encoding process of a joint composite coding and offset-difference coding in accordance with the principles of this invention.

If the comparison result in step 1060 indicates that the data P is less than data L, joint composite coding and offset-difference coding encoding process 1050 then compares the difference between data L and data P, i.e. (L–P), to a predetermined threshold T2 in step 1062. If (L–P) is greater than threshold T2, then joint composite coding and offset-difference coding encoding process 1050 encodes data P with a fixed-length coding scheme in step 1066 and encodes data L with variable-length coding scheme in step 1071. If, however, (L–P) is not greater than threshold T2, joint composite coding and offset-difference coding encoding process 1050 then replaces data L with (L–P), generates indicator i with a unique pattern to indicate the data that has been replaced, and forms a new data set: <i, L–P, P> in step 1067. Joint composite coding and offset-difference coding encoding process 1050 then encodes data P with a variable-length coding scheme and generates identifier I to indicate the selected coding scheme in step 1068, and encodes (L–P) with variable-length coding in step 1070. Joint composite coding and offset-difference coding encoding process 1050 then generates either codeword <coded L, coded P> or <I, i, coded (L–P), coded P> in step 1072 and appends the codeword to an output data stream 1002. FIG. 12 illustrates an example of an output data stream wherein $C_1$ 1200 is a codeword of coded L 1202 and coded (P–L) 1203 with identifier I 1201, $C_2$ 1210 is a codeword of coded (L–P) 1213 and coded P 1214 with both identifier I 1211 and indicator i 1212, and $C_3$ 1220 is a codeword of coded L 1221 and coded P 1222 without either identifier I or indicator i.

Joint composite coding and offset-difference coding encoding process 1050 then continues encoding the next input data pair 1001.

Threshold T1 is calculated as same as before. Threshold T2, however, is a bit different due to the fact that when the statistically larger data P is smaller than data L, an indicator i may be generated. Thus threshold T2 is calculated with the same principle from the following:

$$L(I)+L(i)+C_v(K)<C_f(\theta)$$

where L(I) is the number of bits to represent identifier I, L(i) is the number of bits to represent indicator i, $C_v(K)$ is the number of bits for encoding an input data with selected variable-length coding, and $C_f(\theta)$ is the number of bits for encoding an input data with selected fixed-length coding. Since L(I), L(i) and $C_f(\theta)$ are fixed, the only variable is $C_v(K)$. Therefore threshold T2 can be set at the largest K that satisfies this equation.

Figure 11A:
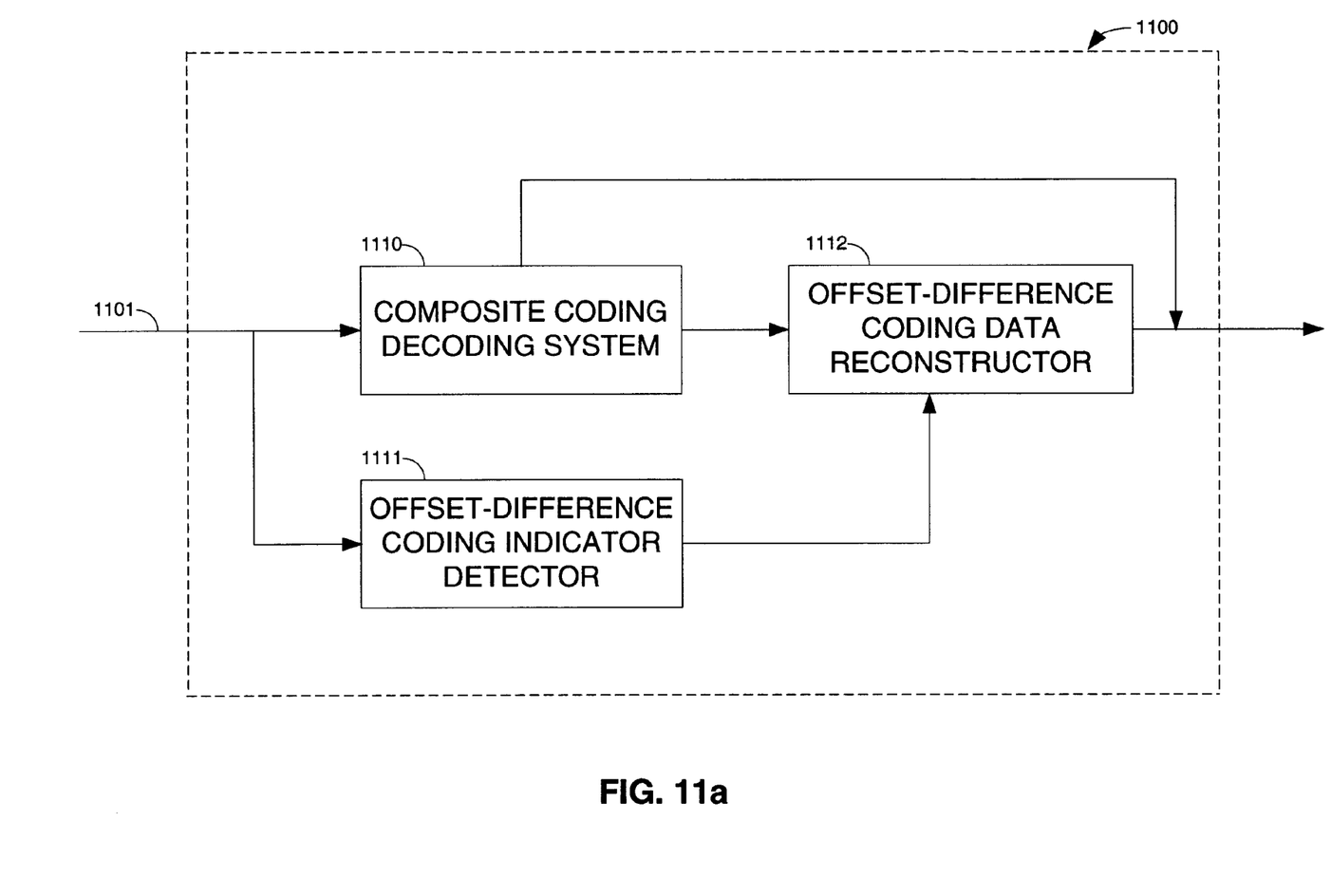

FIG. 11a illustrates a detailed block diagram of a joint composite coding and offset-difference coding decoding system corresponding to the encoding system shown in FIG. 10a. Composite coding and offset-difference coding decoding system 1100 comprises a composite coding decoding system 1110, an offset-difference coding indicator detector 1111 to decode a coded input data stream 1101, and an offset-difference coding data reconstructor 1112 to reconstruct the original data. Composite coding decoding system 1110 starts to decode a codeword in a coded input data stream 1101 by first detecting the existence of an identifier, then selecting a decoding scheme. The selected decoding scheme also indicates whether offset-difference coding is associated with the encoded data. The composite fixed-variable-length coding decoder 540 of composite coding decoding system 1110 decodes the coded data in accordance with the selected decoding scheme and the stand-alone decoder 520 of composite coding decoding system 1110 decodes the coded data with a variable-length coding scheme (see FIG. 5a). Offset-difference coding indicator detector 1111 detects the existence of an indicator. Offset-difference coding data reconstructor 1112 receives the decoded data from composite coding decoding system 1110 and indication of the replaced data from offset-difference coding indicator detector 1111, then reconstructs the original data.

Figure 11B:
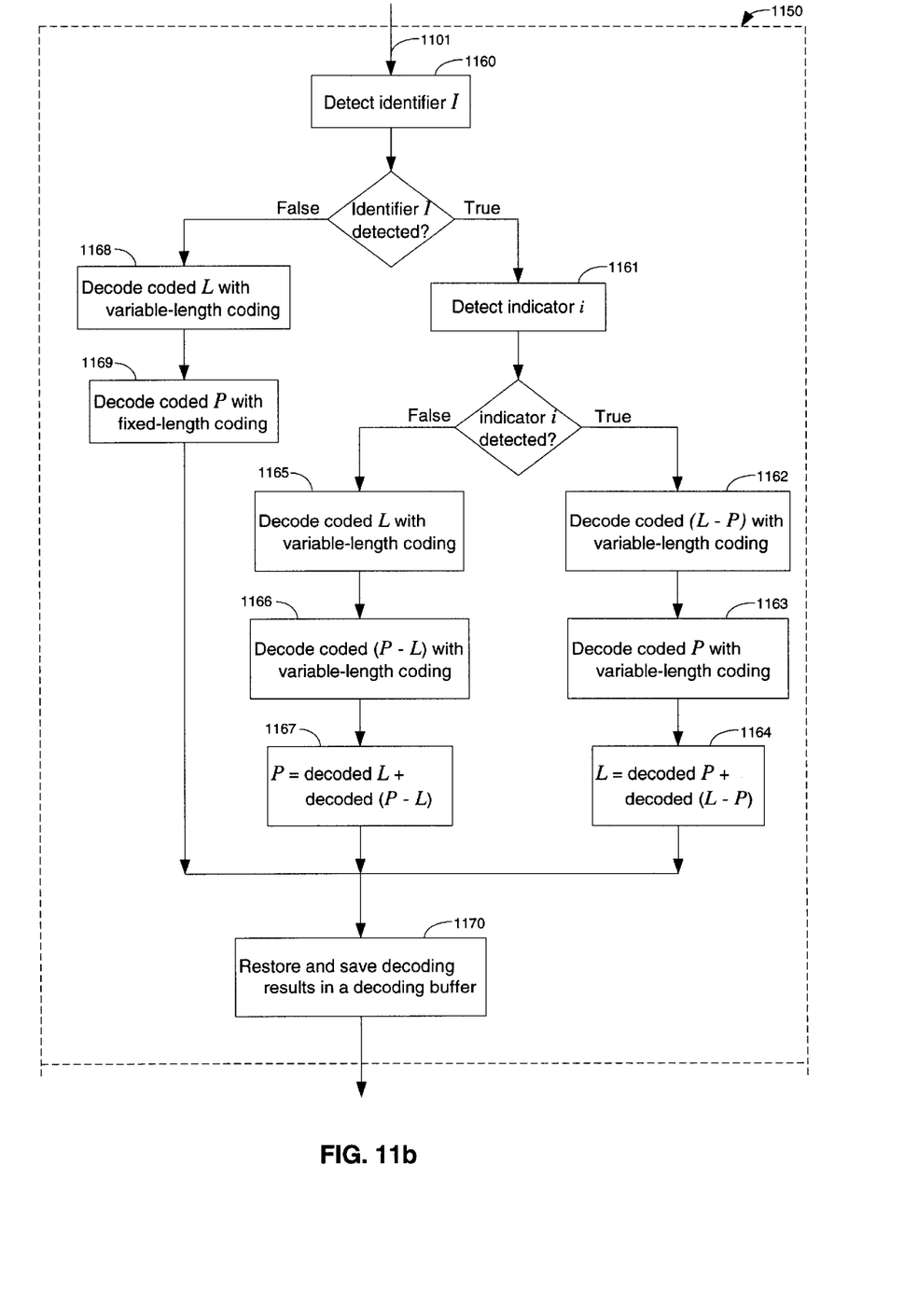
FIG. 11b illustrates a detailed block diagram of a joint composite coding and offset-difference coding decoding process corresponding to the encoding process shown in FIG. 10b.

FIG. 11b illustrates a preferred embodiment of a joint composite coding and offset-difference coding decoding process corresponding to the encoding system shown in FIG. 11a. Joint composite coding and offset-difference coding decoding process 1150 decodes a codeword in a coded input data stream 1101 by first detecting the existence of identifier I in step 1160. If identifier I is detected, joint composite coding and offset-difference coding decoding process 1150 continues detecting the existence of indicator i in step 1161. If indicator i is detected, joint composite coding and offset-difference coding. decoding process 1150 then decodes the next two elements of the codeword: coded (L–P) 1213 with a variable-length coding scheme in step 1162 and coded P 1214 also with variable-length coding in step 1163 (see FIG. 12). Joint composite coding and offset-difference coding decoding process 1150 then recovers data L by adding decoded P to decoded (L–P) in step 1164. If the comparison result in step 1161 indicates that the indicator i is not detected, joint composite coding and offset-difference coding decoding process 1150 then decodes the next two elements of the codeword: coded L 1202 with variable-length coding in step 1165 and coded (P–L) 1203 with a variable-length coding scheme in step 1166. Joint composite coding and offset-difference coding decoding process 1150 then recovers data P by adding decoded L to decoded (P–L) in step 1167. If the comparison result in step 1160 indicates that the identifier I is not detected, joint composite coding and offset-difference coding decoding process 1150 then decodes the current element of the codeword: coded L 1221 with variable-length coding in step 1168 and coded P 1222 with a fixed-length coding scheme in step 1169. Finally, joint composite coding and offset-difference coding decoding process 1150 restores data P and data L to the original data pair (P, L) and saves in a decoding buffer in step 1170, and continues decoding the next codeword of the coded input data 1101.

The composite fixed-variable-length coding process improves coding efficiencies by combining different coding schemes into a single coding scheme to encode data. A predetermined threshold is set at the point when it becomes more efficient to use one scheme over the other. Through a simple testing of a data against the threshold, different coding schemes are interchangeably used on the fly. An identifier is generated to indicate a corresponding coding scheme only when the response of comparing the data to a predetermined threshold differs from a statistically determined response.

The offset-difference coding process minimizes the number of bits required to encode a data by further reducing the value of a data. Data with smaller values require fewer bits to encode, especially in a variable-length coding scheme. An indicator is generated to indicate the data that has been replaced only when the statistically larger data is in fact smaller.

Composite fixed-variable-length coding process and offset-difference coding process may be used independently or together depending on the application. Both processes improve the compression performance without compromising the memory resource and compression/decompression speed. It is envisioned that both processes are especially suitable for compression applications in the environment of Internet where the decoding speed is critical as well as for handheld and wireless devices where the memory resources are limited.

It is understood that while the invention has been particularly shown and described with reference to specific examples, the invention should not be construed to be so limited. One skilled in the art may make various modifications with the benefit of this disclosure without departing from the spirit and scope of the invention.

I claim:

1. A composite fixed-variable-length coding process for encoding an input data in an input data stream and decoding coded data including an encoding process and a decoding process, wherein:

said encoding process comprises the steps of:
  comparing the input data with a threshold, the threshold set at the point when one coding scheme becomes more efficient to use over the other;
  selecting a coding scheme in response to the step of comparing the input data with said threshold;
  encoding said input data in accordance with the selected coding scheme;
  generating an identifier to indicate the selected coding scheme only if the response to comparing said input data with said threshold is different from a predetermined response;

said decoding process comprises the steps of:
  detecting whether the identifier exists;
  selecting a decoding scheme in response to the step of detecting whether the identifier exists; and decoding the coded data in accordance with the selected decoding scheme.

2. The composite fixed-variable-length coding process of claim 1 further comprising means for calculating said threshold based on two preselected coding schemes.

3. The composite fixed-variable-length coding process of claim 1, wherein said step of selecting a coding scheme further comprising selecting a coding scheme from two preselected coding schemes.

4. A composite fixed-variable-length coding system for encoding a paired input data (X, Y) in an input data stream, comprising the steps of:
  comparing input data X with a predetermined threshold, the threshold set at the point when one coding scheme becomes more efficient to use over the other;
  wherein if said input data X exceeds said predetermined threshold, then selecting a coding scheme, which is more efficient for coding data with larger values; from two preselected coding schemes;
  wherein if said input data X does not exceed said predetermined threshold, then selecting a coding scheme, which is more efficient for coding data with smaller values, from two preselected coding schemes;
  encoding said input data X in accordance with the selected coding scheme;
  generating an identifier to indicate the selected coding scheme only if one of the two following conditions is met:
    (1) said input data X is statistically larger than said predetermined threshold and said input data X does not exceed said predetermined threshold, or
    (2) said input data X is not statistically larger than said predetermined threshold and said input data X exceeds said predetermined threshold;
  encoding input data Y with a stand-alone encoder; and
  generating a coded output data beginning with or without the generated identifier, followed by coded input data Y and coded input data X.

5. The composite fixed-variable-length coding system of claim 4 further comprising means for calculating said threshold based on two preselected coding schemes.

6. A composite fixed-variable-length coding system for encoding a paired input data (X, Y) in an input data stream and decoding coded data including an encoding process and a decoding process, wherein:
  said encoding process comprises the steps of:
    comparing input data X with a predetermined threshold, the threshold set at the point when one coding scheme becomes more efficient to use over the other;
    wherein if said input data X exceeds said predetermined threshold, then selecting a coding scheme, which is more efficient for coding data with larger values, from two preselected coding schemes;
    wherein if said input data X does not exceed said predetermined threshold, then selecting a coding scheme, which is more efficient for coding data with smaller values, from two preselected coding schemes;
    encoding said input data X in accordance with the selected coding scheme;
    generating an identifier to indicate the selected coding scheme only if one of the two following conditions is met:
      (1) said input data X is statistically larger than said predetermined threshold and said input data X does not exceed said predetermined threshold, or
      (2) said input data X is not statistically larger than said predetermined threshold and said input data X exceeds said predetermined threshold;
    encoding input data Y with a stand-alone encoder;
    generating a coded output data beginning with or without the generated identifier, followed by coded input data Y and coded input data X;
  said decoding process comprises the steps of:
    detecting whether the identifier exists;
    wherein if no identifier is detected, the decoding process further comprises:
      wherein if input data X is statistically larger than said predetermined threshold, then selecting the coding scheme, which is more efficient for decoding data with larger values, from two preselected coding schemes; and
        wherein if input data X is not statistically larger than said predetermined threshold, then selecting the coding scheme, which is more efficient for decoding data with smaller values, from two preselected coding schemes; and
    wherein if the identifier is detected, the decoding process further comprises:
      wherein if input data X is statistically larger than said predetermined threshold, then selecting the coding scheme, which is more efficient for decoding data with smaller values, from two preselected coding schemes; and
      wherein if input data X is not statistically larger than said predetermined threshold, then selecting the coding scheme, which is more efficient for decoding data with larger values, from two preselected coding schemes.

7. The composite fixed-variable-length coding system of claim 6 further comprising means for calculating said threshold based on two preselected coding schemes.

* * * * *